(12) United States Patent
Pan et al.

(10) Patent No.: US 12,027,422 B2
(45) Date of Patent: Jul. 2, 2024

(54) SEMICONDUCTOR STRUCTURES AND METHODS FOR FORMING THE SAME

(71) Applicant: Winbond Electronics Corp., Taichung (TW)

(72) Inventors: Tseng-Yao Pan, Taichung (TW); Chien-Hsiang Yu, Taichung (TW); Hung-Sheng Chen, Taichung (TW); Ching-Yung Wang, Taichung (TW); Cheng-Hong Wei, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 391 days.

(21) Appl. No.: 17/326,563

(22) Filed: May 21, 2021

(65) Prior Publication Data

US 2021/0398858 A1  Dec. 23, 2021

(30) Foreign Application Priority Data

Jun. 17, 2020 (TW) .................... 109120405

(51) Int. Cl.
*H01L 21/8234* (2006.01)
*G11C 5/02* (2006.01)
*H01L 21/308* (2006.01)
*H10B 41/27* (2023.01)
*H10B 43/27* (2023.01)

(52) U.S. Cl.
CPC .......... *H01L 21/8234* (2013.01); *G11C 5/025* (2013.01); *H01L 21/308* (2013.01); *H10B 41/27* (2023.02); *H10B 43/27* (2023.02)

(58) Field of Classification Search
CPC ... G11C 5/025; H01L 21/0337; H01L 21/308; H01L 21/8234; H10B 12/053; H10B 12/488; H10B 41/27; H10B 43/27
See application file for complete search history.

(56) References Cited

U.S. PATENT DOCUMENTS

2015/0194419 A1* 7/2015 Singh .................. H01L 27/0296
 438/689
2016/0365311 A1 12/2016 Hung et al.

FOREIGN PATENT DOCUMENTS

CN 109727987 A 5/2019
CN 110211959 A 9/2019

* cited by examiner

*Primary Examiner* — Meiya Li
(74) *Attorney, Agent, or Firm* — MUNCY, GEISSLER, OLDS & LOWE, PC (57) ABSTRACT

A method for forming a semiconductor structure includes: forming an active layer on a substrate; forming hard masks on the active layer, wherein a first spacing is disposed between two closely spaced hard masks in a predetermined word line region nearest to a predetermined selective gate region, wherein the first spacing is less than a second spacing between any two of the hard masks other than the two closely spaced hard masks; forming spacers on the sidewalls of the hard masks, wherein two spacers on opposite sides of the sidewalls of the closely spaced hard masks merge into a combined spacer; and transferring the patterns of the spacers to the active layer to form word lines. The step of transferring the patterns of the spacers includes transferring the pattern of the combined spacer to the active layer to form a first word line.

16 Claims, 9 Drawing Sheets

SEMICONDUCTOR STRUCTURES AND METHODS FOR FORMING THE SAME

CROSS REFERENCE TO RELATED APPLICATIONS

This application claims priority of Taiwan Patent Application No. 109120405, filed on Jun. 17, 2020, the entirety of which is incorporated by reference herein.

BACKGROUND

Technical Field

The present disclosure relates to semiconductor technique, and particularly it relates to semiconductor structures of the flash memory and methods for forming the same.

Description of the Related Art

In recent years, flash memory has become the mainstream option for nonvolatile memory devices. Its advantages include high density, low cost, and being rewritable and electrically erasable. Also, flash memory is commonly applied to various portable electronic products such as notebook computers, MP3 players, digital cameras, mobile phones, and game consoles. In order to increase the density of components in a flash memory device and improve its overall performance, current manufacturing techniques for dynamic random access memory devices continue to work toward scaling down the devices.

However, many challenges have also arisen during the course of this scaling-down trend. For example, in the process of manufacturing a semiconductor, in order to define the features in the active layer, a patterned mask layer is usually formed in a lithography and etching process. However, when a small-sized semiconductor structure is formed, it is easy to be injured or broken due to the surrounding structure during the fabrication process, thereby affecting its subsequent electrical performance.

Even though current flash memory formation method may be adequate for its intended purposes, it has not been entirely satisfactory in every respect. Therefore, flash memory and the methods for forming the same still need further improvements in order to overcome the problems caused by scaling them down, thereby improving the process window and reducing the manufacturing cost.

BRIEF SUMMARY

In accordance with some embodiments of the present disclosure, a method for forming the semiconductor structure is provided. The method includes forming an active layer on a substrate, wherein the substrate has a predetermined word line region and a predetermined selective gate region adjacent thereto; forming a hard mask stack on the active layer, wherein the hard mask stack comprises a first hard mask layer, a second hard mask layer, and a third hard mask layer sequentially formed on the active layer; patterning the third hard mask layer to form third hard masks in the predetermined word line region and the predetermined selective gate region, wherein a first spacing is disposed between two closely spaced third hard masks in the predetermined word line region nearest to the predetermined selective gate region; forming spacers on sidewalls of the third hard masks, wherein two spacers on opposite sides of the sidewalls of the closely spaced third hard masks merge into a combined spacer; removing the third hard masks; forming a patterned mask structure in the predetermined selective gate region, wherein the patterned mask structure covers the second hard mask layer and the spacers; and transferring patterns of spacers to the active layer to form word lines in the predetermined word line region and transferring the pattern of the patterned mask structure to the active layer to form a selective gate in the predetermined selective gate region. The first spacing is less than a second spacing between any two of the third hard masks other than the two closely spaced third hard masks. The step of transferring the patterns of the spacers comprises transferring the pattern of the combined spacer to the active layer in order to form a first word line nearest the selective gate.

In accordance with some embodiments of the present disclosure, a semiconductor structure is provided. The semiconductor structure includes a substrate, a word lines disposed on the substrate, a selective gate disposed on the substrate, and a doping region disposed in the substrate between the word lines and disposed in the substrate between the word lines and the selective gate. The word lines comprise a first word line nearest to the selective gate, and the first word line is wider than any one of the word lines other than the first word line.

DETAILED DESCRIPTION

In NAND flash memory, cell structures are formed and defined by self-aligned double patterning (SADP) process and selective gates near the cell structures are formed and defined by photoresist. In prior art, the first array nearest the selective gate is vulnerable to plasma damage during the etching process due to the difference in structural environment, and thus may be damaged or disconnected and affect subsequent electrical performance. To solve the above problem, the present disclosure reduce the spacing between the hard masks near the predetermined selective gate region, causing the two spacers in the spacing to merge into a wider combined spacer, thereby preventing subsequent plasma damage from the etching process and thus avoiding affecting the electrical properties.

Figure 1:
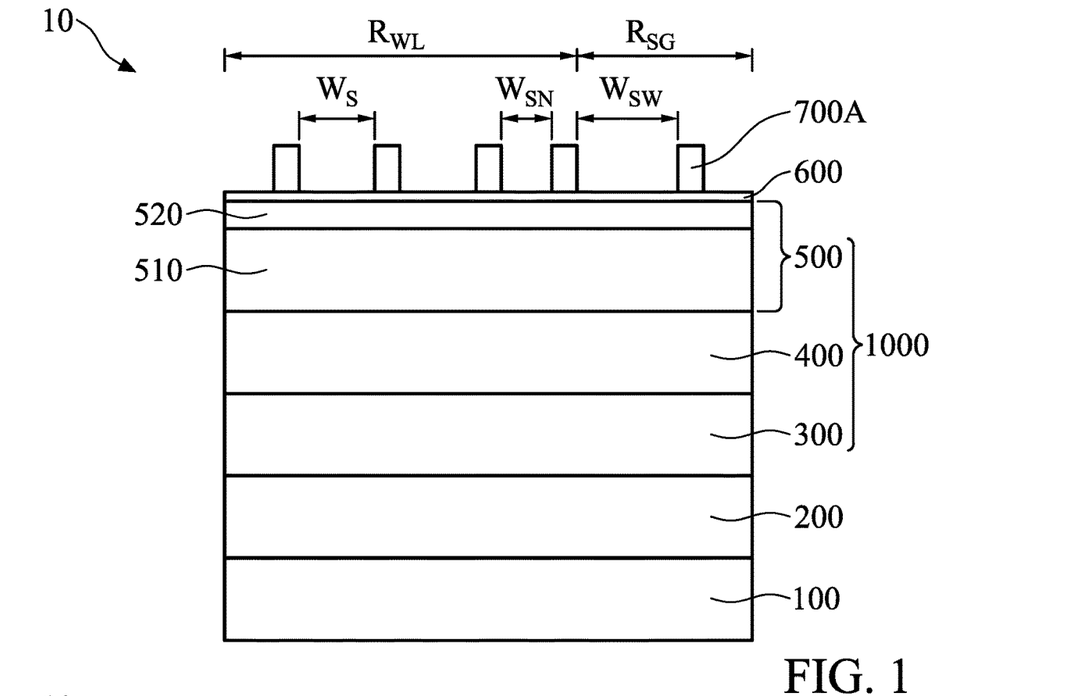
FIGS. 1-16 illustrate cross-sectional views of a semiconductor structure at various stages according to some embodiments of the present disclosure.

FIGS. 1-16 illustrate cross-sectional views of forming a semiconductor structure 10 at various stages according to some embodiments of the present disclosure. Referring to FIG. 1, an active layer 200 on a substrate 100, a hard mask stack 1000 on the active layer 200, an anti-reflection coating layer 600 on the hard mask stack 1000, and a patterned photoresist 700A on the anti-reflection coating layer 600 are formed. The hard mask stack includes a first hard mask layer 300, a second hard mask layer 400, and a third hard mask layer 500 sequentially formed on the active layer 200. In addition, the substrate 100 has a predetermined word line region $R_{WL}$ and a predetermined selective gate region $R_{SG}$ adjacent thereto to distinguish the position of the subsequently formed element.

In some embodiments, the substrate 100 may be a semiconductor substrate, such as a silicon substrate. In other embodiments, the semiconductor substrate may be an elemental semiconductor including germanium; a compound semiconductor including gallium nitride (GaN), silicon carbide, gallium arsenide, gallium phosphide, indium phosphide, indium arsenide and/or indium antimonide and the like. In other embodiments, the substrate 100 may also be a semiconductor on insulator substrate (SOI), and the semiconductor on insulator substrate may include a bottom plate, an embedded oxide layer disposed on the bottom plate, and a semiconductor layer disposed on the embedded oxide layer.

In some embodiments, the active layer 200 may be made of conductive materials, dielectric materials, or a combination thereof. The conductive materials may be a doped polycrystalline silicon, a metal (such as tungsten (W)), a metal nitride (such as tungsten nitride (WN)), or the like. Examples of dielectric materials include silicon oxide, silicon nitride, silicon oxynitride, phosphosilicate glass (PSG), borophosphosilicate glass (BPSG), undoped silicate glass (USG), tetraethoxysilane (TEOS), low dielectric constant dielectric materials, other suitable dielectric materials, and the like. The formation of the active layer 200 may be formed through a deposition process, such as chemical vapor deposition (CVD).

In some embodiments, the active layer 200 may include a tunneling oxide layer, a floating gate layer, a control gate layer, an inter-gate dielectric layer (not shown). It should be understood that not all features in the active layer 200 are shown herein for clearly describing some of the embodiments of the present disclosure and emphasizing technical features of the present disclosure.

In some embodiments, the first hard mask layer 300 and the second hard mask layer 400 are sequentially formed on the active layer 200. The first hard mask layer 300 may include oxide or oxynitride, such as tetraethyl orthosilicate (TEOS) oxide or silicon oxynitride (SiON). In some embodiments, the second hard mask layer 400 may include materials having etching selectivity to the films underneath, such as polycrystalline silicon. The formation of the first hard mask layer 300 and the second hard mask layer 400 is similar to the deposition process of the active layer 200, and thus is not repeated here.

In some embodiments, the third hard mask layer 500 is formed on the second hard mask layer 400. The third hard mask layer 500 may include a dielectric layer 510 and a sacrificial layer 520 on the dielectric layer 510.

In some embodiments, the dielectric layer 510 may include photoresist-like (PR-like) materials, including carbon-containing materials or oxygen-containing materials, such as spin-on carbon (SOC), carbon (C), or tetraethyl orthosilicate (TEOS) oxide, or the like. The sacrificial layer 520 may include oxynitride, such as silicon oxynitride (SiON). The formation of the dielectric layer 510 and the sacrificial layer 520 of the third hard mask layer 500 is similar to the deposition process of the active layer 200, and thus is not repeated here.

The property of the dielectric layer 510 is similar to that of the photoresist thereon, and thus the sacrificial layer 520 disposed under the dielectric layer 510 may act as an anti-etching layer, which is an etching stop layer.

It should be understood that some embodiments of the present disclosure utilize the difference in etching selectivity between the first hard mask layer 300, the second hard mask layer 400, and the third hard mask layer 500 to etch the specific films at the various etching process subsequently (details will be described in the following). Therefore, materials of each films of the hard mask stack 1000 mentioned here are exemplary, and may be changed to suitable mask materials depending on the process condition, and the present disclosure is not limit thereto.

In some embodiments, an anti-reflection coating layer 600 is formed on the third hard mask layer 500. The anti-reflection coating layer 600 may be made of spin-on carbon (SOC), silicon oxynitride (SiON), another suitable anti-reflection material, a combination thereof, or the like.

In some embodiments, the formation of the anti-reflection coating layer 600 is similar to the deposition process of the active layer 200, and thus is not repeated here.

The anti-reflection coating layer 600 may prevent the films underneath from reflection during exposure, facilitating transferring patterns.

In some embodiments, patterned photoresists 700A are formed on the anti-reflection coating layer 600.

In these embodiments, the spacing $W_{SN}$ is formed between the two closely spaced patterned photoresists 700A in the predetermined word line region $R_{WL}$ nearest to the predetermined selective gate region $R_{SG}$. The spacing $W_S$ is formed between any two patterned photoresists 700A other than the two closely spaced patterned photoresists 700A in the predetermined word line region $R_{WL}$. The spacing $W_{SW}$ is formed between two closely spaced patterned photoresists 700A in the predetermined selective gate region $R_{SG}$ nearest the predetermined word line region $R_{WL}$. It should be known from FIG. 1, the spacing $W_{SN} < W_{SW}$, and $W_{SN} < W_S$. From the following description, as the spacing $W_{SN}$ becomes smaller, the spacer material formed here will be merged into a wider combined spacer subsequently.

Figure 2:
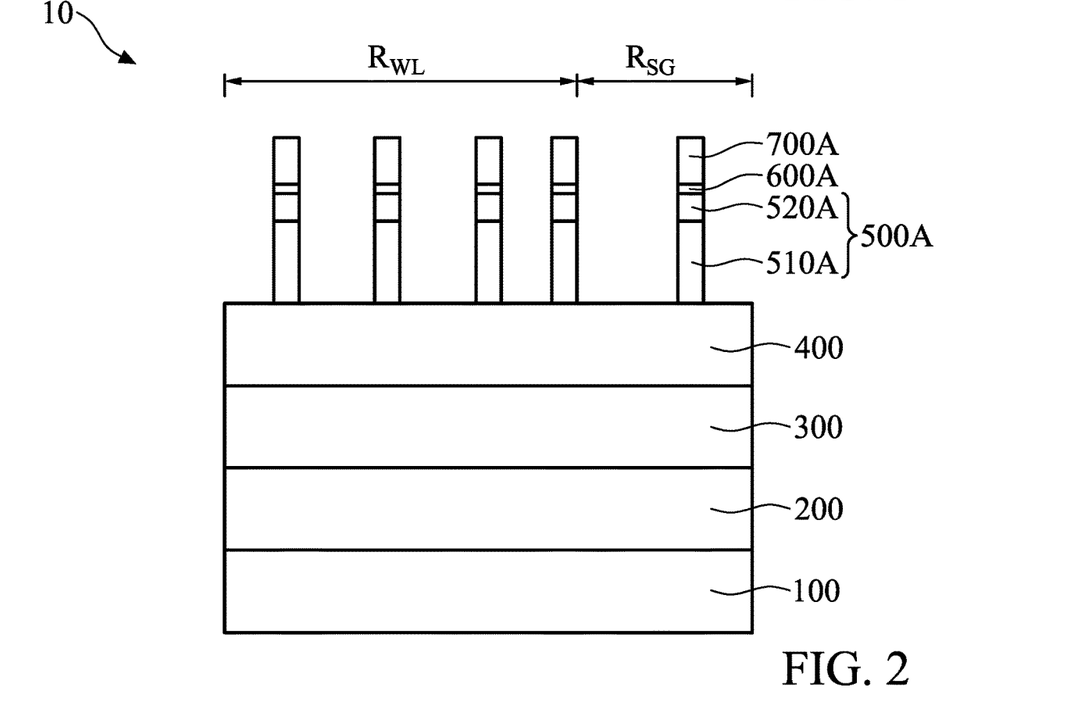
Figure 3:
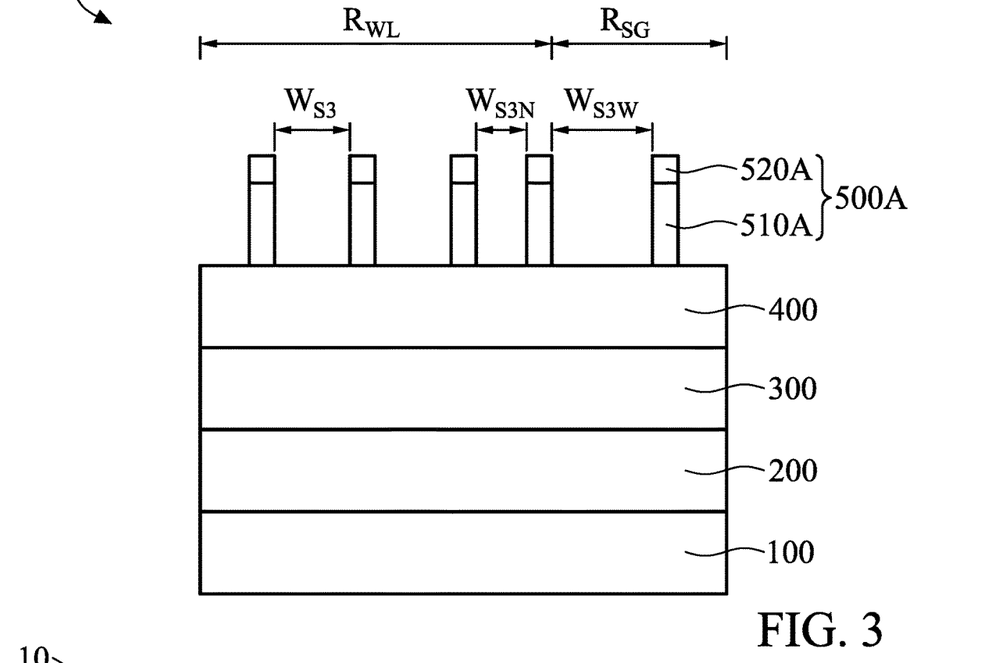

Next, referring to FIGS. 2-3, patterns of the patterned photoresists 700A are transferred to the anti-reflection coating layer 600 and the third hard mask 500 in order to form patterned anti-reflection coating layers 600A and third hard masks 500A, as shown in FIG. 2. Then, the patterned anti-reflection coating layers 600A and the third hard masks 500A are removed, resulting in the structure as shown in FIG. 3. From the above description, the patterns of the patterned photoresists 700A transferred to the third hard mask layer 500 includes the patterns of the patterned photoresists 700A transferred to the dielectric layer 510 and the sacrificial layer 520 of the third hard mask layer 500 to form dielectric masks 510A and sacrificial masks 520A.

In the embodiment of FIG. 3, the spacing $W_{S3}$, $W_{S3N}$, and $W_{S3W}$ of the third hard masks 500A are corresponding to the spacing $W_S$, $W_{SN}$, and $W_{SW}$ of the patterned photoresists 700A. It should be known from FIG. 3, the spacing $W_{S3N} < W_{S3W}$, and $W_{S3N} < W_{3S}$. It should also be know from the following description, as the spacing $W_{S3N}$ becomes smaller, the spacer material formed here will be merged into a wider combined spacer subsequently. Furthermore, the ratio of the spacing $W_{S3}$ and the spacing $W_{S3N}$ is greater than or equal to 1.5 and less than 3. When the ratio is less than 1.5, two spacers will not be merged into a wider combined spacer subsequently. When the ratio is greater than or equal to 3, a combined spacer that is wider than other spacers cannot be defined.

In some embodiments, the third hard masks 500A may be referred as mandrels, facilitating subsequent formation of spacers on both sides of the third hard masks 500A with the width less than the lithography resolution.

In some embodiments, the removal of patterned photoresists 700A and the patterned anti-reflection coating layers 600A may include strip process, ash process, suitable removal process, the combination thereof, or the like.

Figure 4:
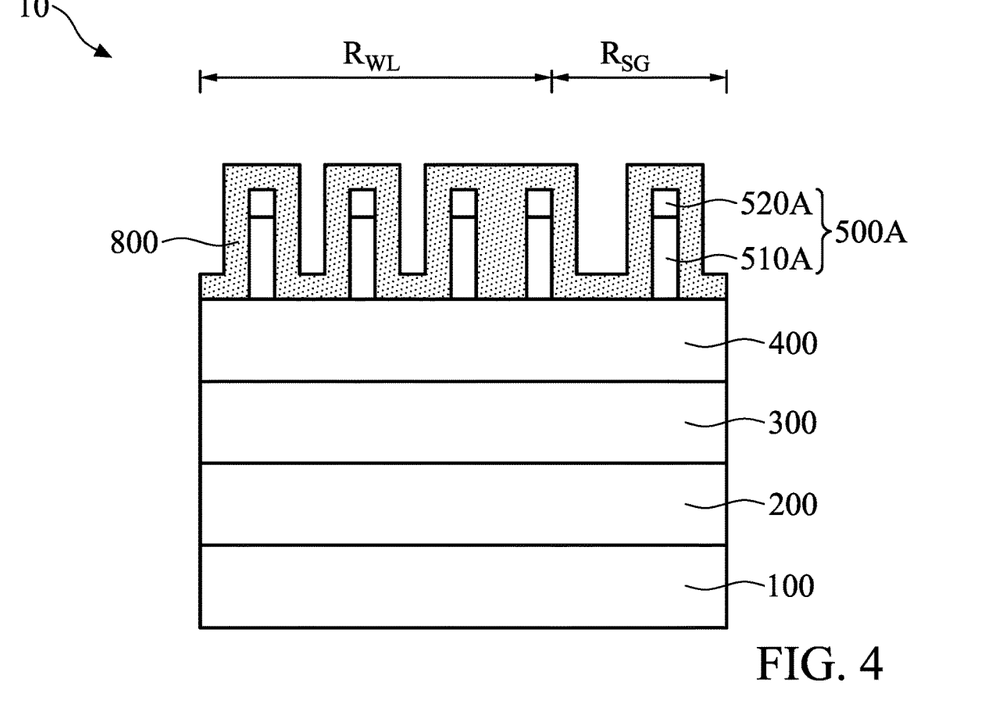

Next, referring to FIG. 4, a spacer material layer 800 is conformally deposited on the top surface and the sidewalls of the third hard masks 500A and on the second hard mask layer 400. Specifically, the spacer material layer 800 deposited on the top surface and the sidewalls of the third hard masks 500 includes the spacer material layer 800 deposited on the top surface and the sidewalls of the sacrificial masks 520A of the third hard masks 500 and on the sidewalls of the dielectric masks 510A of the third hard masks 500.

In some embodiments, the deposition of the spacer material layer 800 is similar to the deposition process of the active layer 200, and thus is not repeated here. In another embodiment, the spacer material layer 800 includes the dielectric materials similar to the above, and thus is not repeated here.

In the embodiment, at the position corresponding to the smaller spacing $W_{S3N}$ between the third hard masks 500A, the spacer material layer 800 is merged. In other words, in the predetermined word line region $R_{WL}$ nearest the predetermined selective gate region $R_{SG}$, no gap is formed in the spacer material layer 800 on the opposite sidewalls of the two closely spaced third hard masks 500A.

Figure 5:
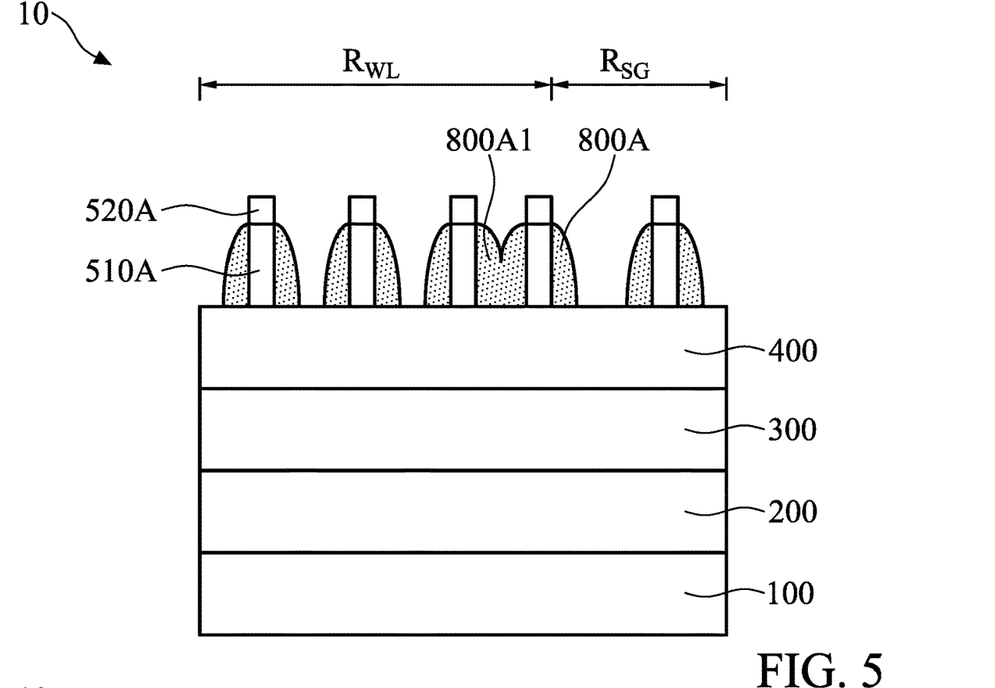

Next, referring to FIG. 5, the spacer material layer 800 is anisotropically etched until a portion of a top surface of the second hard mask layer 400 is exposed to form spacers 800A. Specifically, anisotropically etching the spacer material layer 800 includes the removal of the spacer material layer on the top surface and the sidewalls of the sacrificial masks 510A. In addition, a combined spacer 800A1 is formed at the position corresponding to the smaller spacing $W_{S3N}$ between the third hard masks. Unless otherwise specified, for the sake of brevity, the spacers 800A include the combined spacer 800A1.

In the embodiment, the top surface of each of the spacers 800A is level with the interface of each of the dielectric masks 510A and each of the sacrificial masks 520A. In another embodiment, the top surface of each of the spacers 800A may be higher than or lower than the interface of each of the dielectric masks 510A and the each of the sacrificial masks 520A (not shown).

In some embodiments, due to the effect of the etching process, the top portion of the combined spacer 800A1 has a V-shaped profile. Since the spacer material layer 800 is formed along the sidewalls of the third hard masks 500A, the both sides of the combined spacer 800A1 has substantially straight sidewalls. The width of the combined spacer 800A1 is wider than that of other spacers. The ratio of the width of the combined spacer 800A1 to the width of the spacers other than the combined spacer is greater than 1 and less than or equal to 2. By forming the combined spacer wider than the other spacers, the present disclosure provides a greater critical dimension to resist plasma damage when subsequently defining the selective gate.

In some embodiments, the anisotropic etching includes the etching process mentioned above, and thus is not repeated here.

Compared to the third hard masks formed only by dielectric masks, the third hard masks of the disclosure include both dielectric masks and sacrificial masks, and thus the sacrificial masks may act as an etching stop layer to prevent the photoresist removal step from impacting the dielectric layer and distorting the pattern.

When the top surface of each of the spacers 800A is level with the interface of each of the dielectric masks 510A and each of the sacrificial masks 520A, the sacrificial masks 520A may completely expose on the spacers 800A. In such way, the sacrificial masks 520A may be completely removed in a single step subsequently without affecting the dielectric masks 510A.

Figure 6:
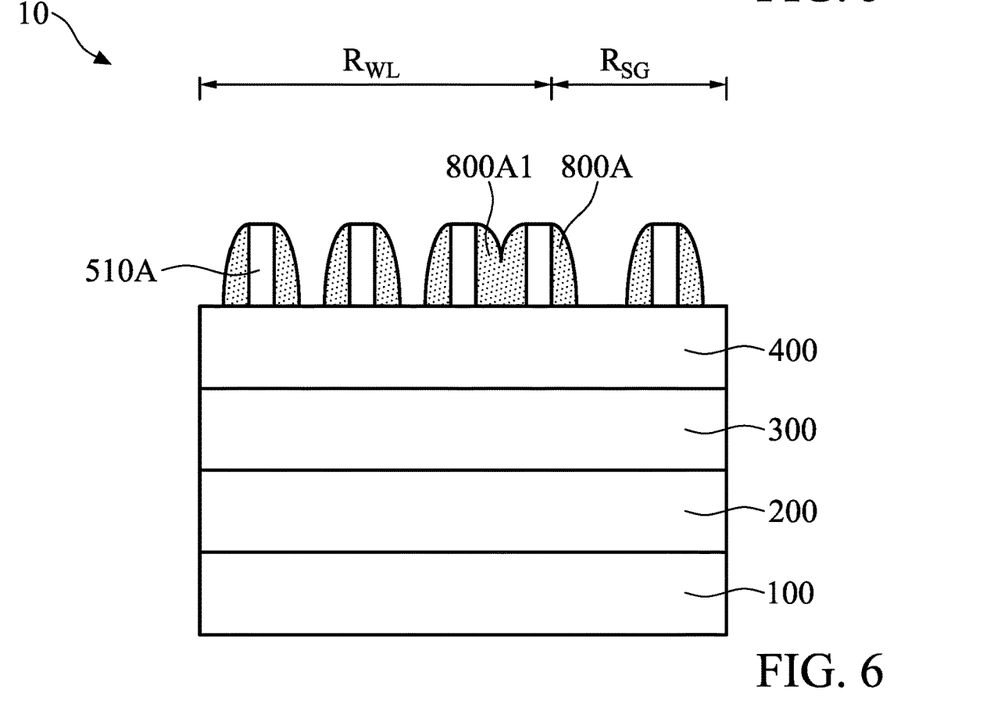
Figure 7:
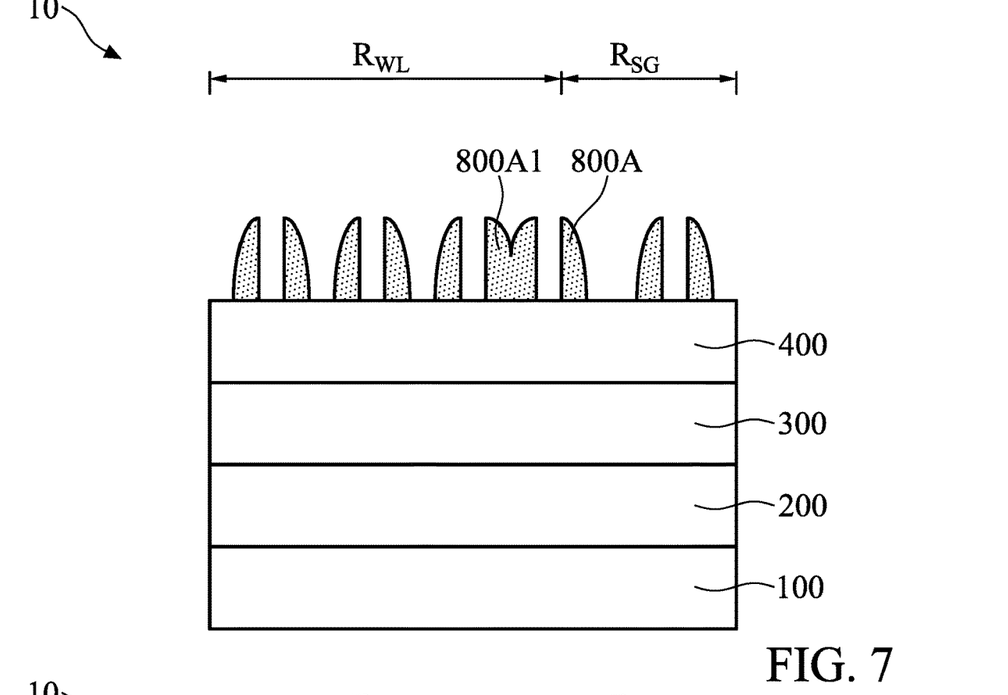

Next, referring to FIGS. 6-7, the third hard masks 500A are removed. Specifically, the sacrificial masks 520A and the dielectric masks 510A are sequentially removed. The removal of the sacrificial masks 520A includes the etching process similar to that previously mentioned. The removal of the dielectric masks 510A may be formed via an etching process, a strip process, an ash process, another suitable removal process, or a combination thereof. It is similar to what has previously been mentioned.

In the embodiment, the material properties of the dielectric masks 510A and the sacrificial masks 520A are different. For example, the former is the photoresist-like (PR-like) material, while the latter is silicon-rich material. In the embodiment of FIGS. 6-7, the sacrificial masks 520A may first be removed to expose the top surface of the dielectric masks 510A, and the dielectric masks 510A may then be removed to remain the spacers 800A, which will define the word lines subsequently.

Figure 8:
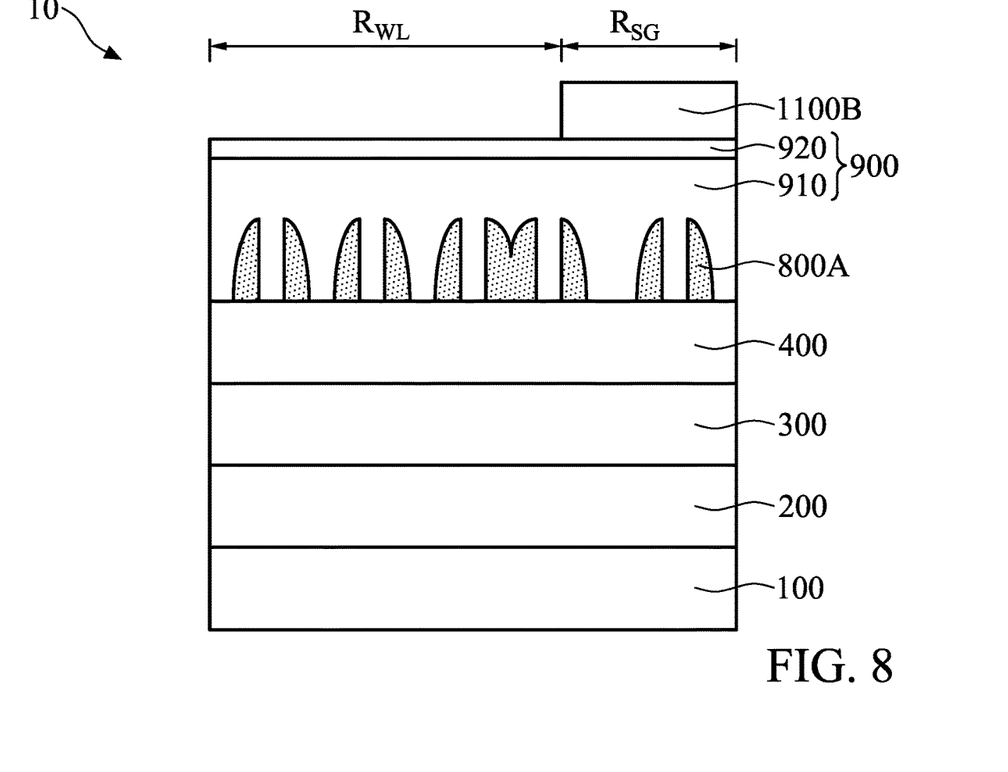

Next, referring to FIG. 8, a mask structure 900 covering the second hard mask layer 400 and the spacers 800A is formed, and another patterned photoresist 1100B is formed on the mask structure 900 in the predetermined selective gate region $R_{SG}$. Specifically, the mask structure 900 includes the dielectric layer 910 and the sacrificial layer 920, and the materials and the formation of which are similar to the dielectric layer 510 and the sacrificial layer 520 of the third hard mask layer 500.

It should be noted that the height of the dielectric layer 910 is higher than that of the spacers 800A to protect the first hard mask layer 300 from etching damage. Specifically, the ratio of the height of the dielectric layer 910 to that of the spacers 800A is greater than or equal to 1.5 to ensure the spacers 800A are completely covered and the top surface of the dielectric layer 910 is substantially planar. For example, the height of the spacers 800A may be about 100 nm, and the height of the dielectric layer 910 may at least be 150 nm, preferably 200 nm or more. In addition, due to the cost and yield (efficiency) consideration, the ratio of the height of the dielectric layer 910 to that of the spacers 800A is preferably 10 or less.

In addition, the sacrificial layer 920 is preferably formed on the dielectric layer 910, which is functioned similar to the sacrifice 520, and thus is not repeated here. The height of the sacrificial layer 920 is not particularly limited as long as the sacrificial layer 920 can substantially block the dielectric layer 910 from the patterned photoresist 1100B.

Compared to the patterned photoresist 1100B formed directly on the second hard mask layer 400, the mask structure 900 is first formed under the patterned photoresist 1100B in the present disclosure, facilitating exposure of the photoresist. In addition, the mask structure may also serve as covering layer, which covers the spacers 800A and the second hard mask layer 400, resulting in the top surface of the mask structure 900 being substantially planar, and facilitating forming the patterned photoresist 1100B.

Figure 9:
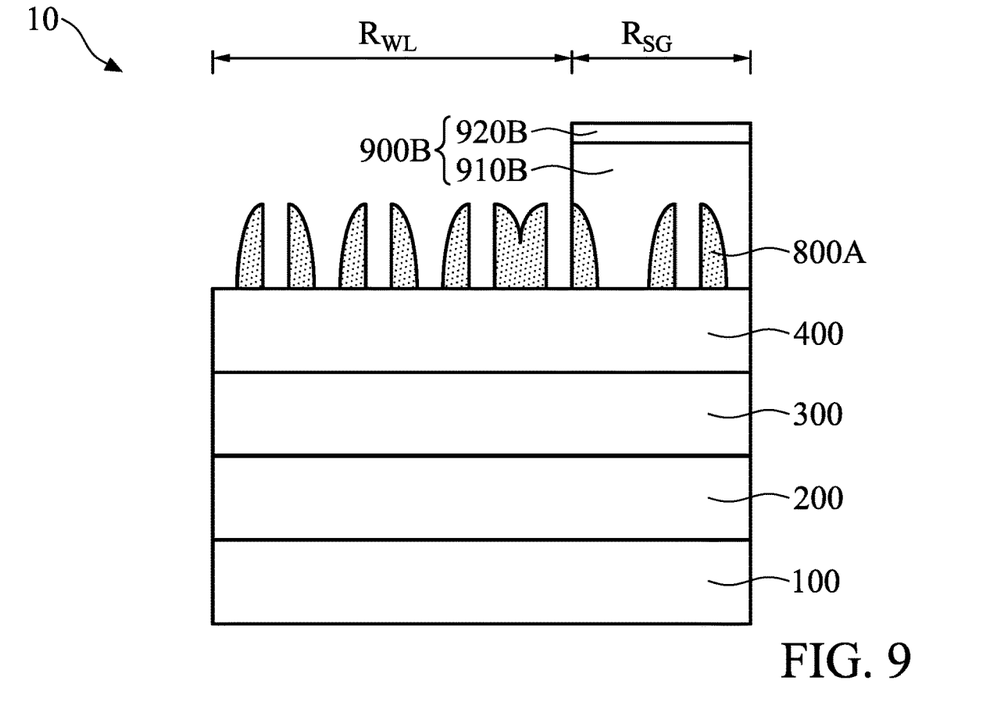

Next, referring to FIG. 9, the pattern of the patterned photoresist 1100B is transferred to the mask structure 900 to form a patterned mask structure 900B, and then the patterned photoresist 1100B is removed. Specifically, the transfer of the pattern includes transferring the pattern of the patterned photoresist 1100B to the dielectric layer 910 and sacrificial layer 920 to form the patterned dielectric layer 910B and the patterned sacrificial layer 920B. In some embodiments, the transfer of the pattern includes the etching process as mentioned above, and thus is not repeated here.

Figure 10:
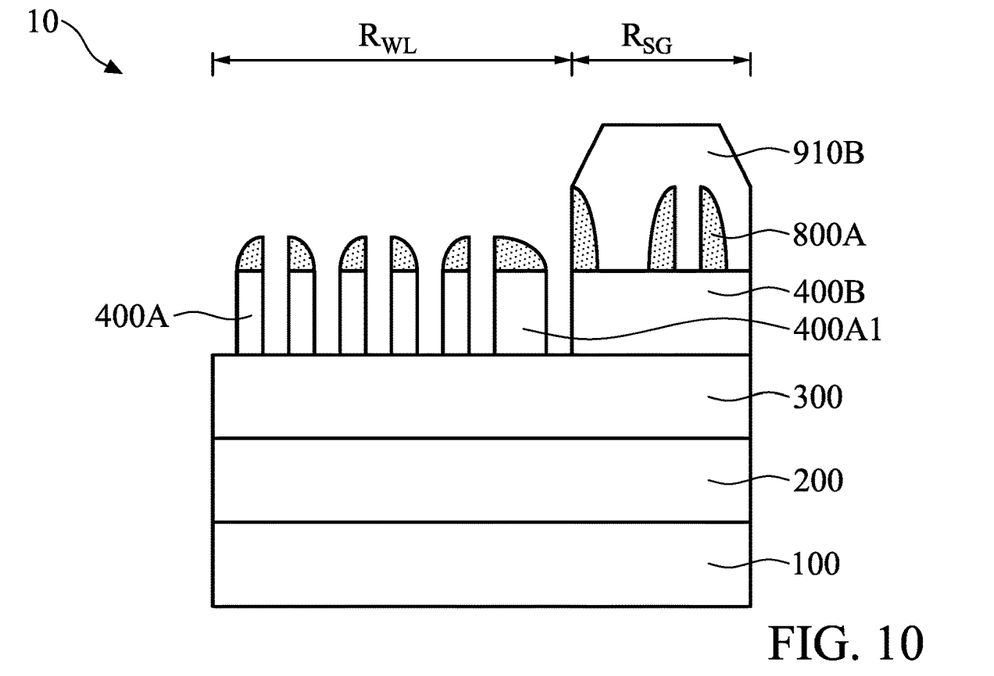

Next, referring to FIG. 10, the patterns of the spacers 800A and the patterned mask structure 900B are transferred to the second hard mask layer 400 to form second hard masks 400A in the predetermined word line region $R_{WL}$ and form second hard masks 400B in the predetermined selective gate region $R_{SG}$. It should be noted that the pattern of combined spacer 800A1 is also transferred to the second hard mask layer 400 to form a comparably wider second hard mask 400A1 in the predetermined word line region $R_{WL}$. In the embodiment, the transfer of the patterns of the spacers 800A and the patterned mask structure 900B includes etching the second hard mask layer 400 by using the spacers 800A and the patterned mask structure 900B as the etching masks and the etching process is similar to that previously mentioned.

During the transfer of the patterns shown in FIG. 10, since the height of the patterned mask structure 900B is higher than that of the spacers 800A, the corners on both sides of the patterned mask structure 900B will be etched together during the etching. In other words, during the etching, the corners of the patterned mask structure 900B are rounded and thus the etching plasma may easily damage the pattern profile of the combined spacer 800A1 along the rounding corner and change (reduce) its size. Therefore, compared to the spacers with the same width in prior art, the combined spacer 800A1 wider than other spacers 800A provided by the present disclosure, which is near the patterned mask structure 900B, may resist damage caused by plasma during the etching process and solve the problem of disconnection.

In the embodiment of FIG. 10, it can be observed that the height of the spacers 800A in the predetermined word line region $R_{WL}$ is also reduced as the patterns of the spacers 800A are transferred to the second hard mask layer 400. However, the height of the spacers 800A in the predetermined selective gate region $R_{SG}$ is higher due to the protection of the patterned dielectric layer 910B. It should be noted that the combined spacer 800A1 formed in FIG. 5 has a V-shaped profile, but during the transfer of the patterns in FIG. 10, the combined spacer 800A1 may become arc profile due to the etching process.

In addition, during the transfer of the patterns, the overlying patterned sacrificial layer 920B may be etched away, as shown in FIG. 10. Alternatively, after the transfer of the patterns, the patterned sacrificial layer 920B may be removed in another etching process (not shown).

Figure 11:
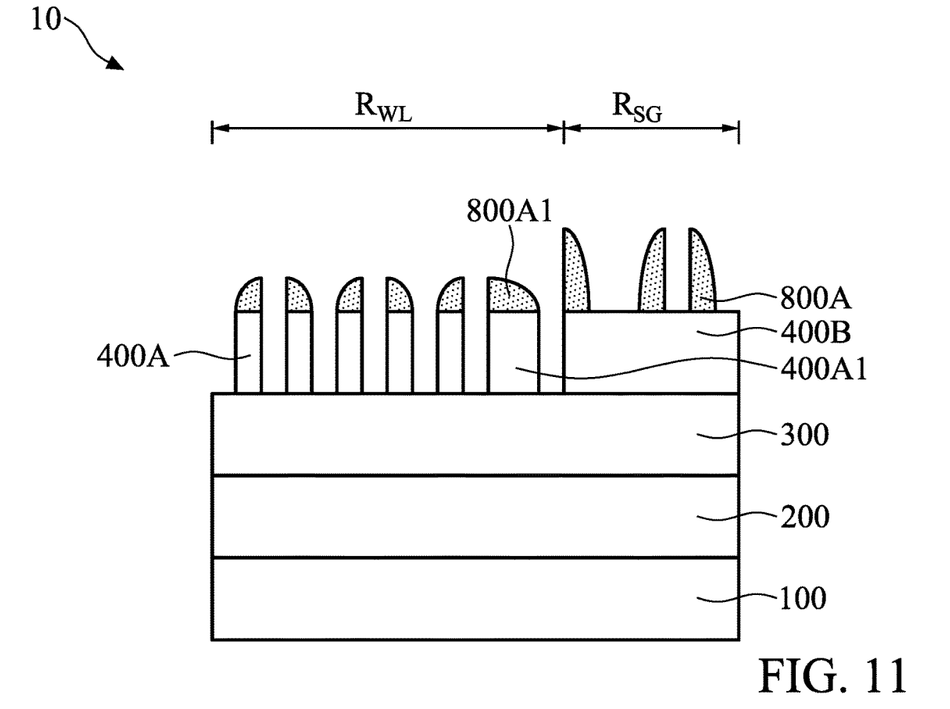

Next, referring to FIG. 11, the patterned mask structure 900 is removed to expose all the spacers 800A. In the embodiment of FIG. 11, since the patterned sacrificial layer 920B is removed together during the transfer of the patterns, only the patterned dielectric layer 910B is required to be removed. In the embodiment, the removal of the patterned mask structure 900 includes a removal process similar to that of the third hard masks 500A and thus is not repeated here.

Figure 12:
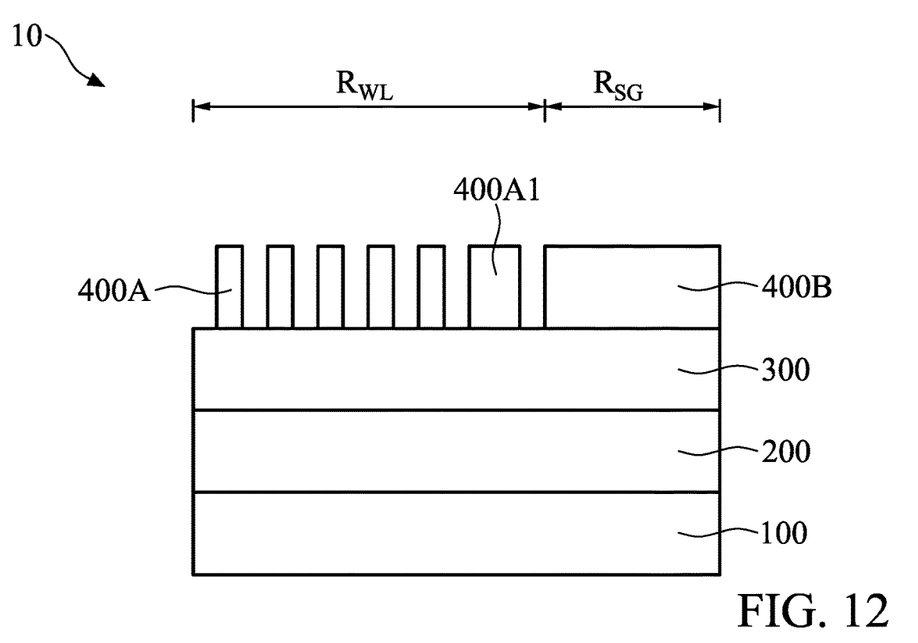
Figure 13:
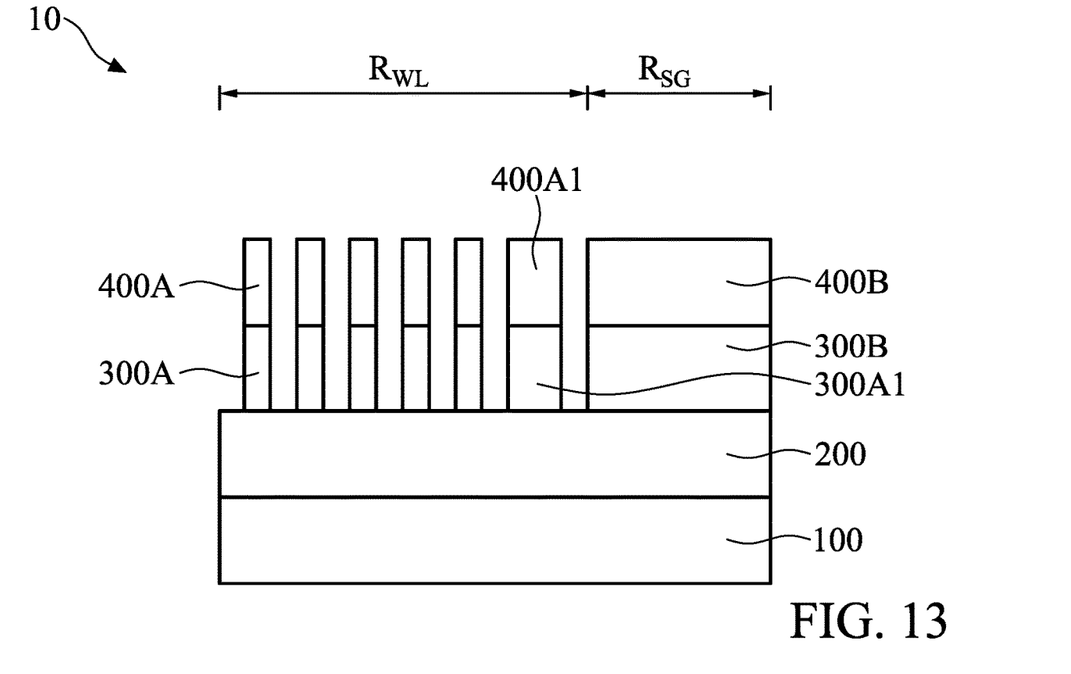
Figure 14:
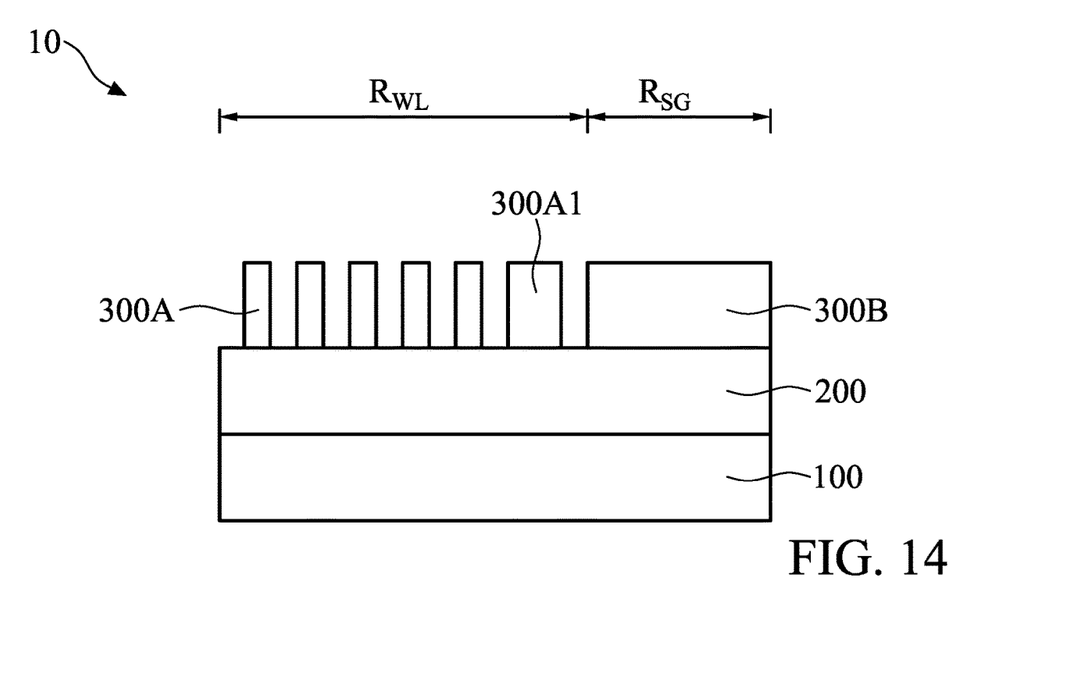
Figure 15:
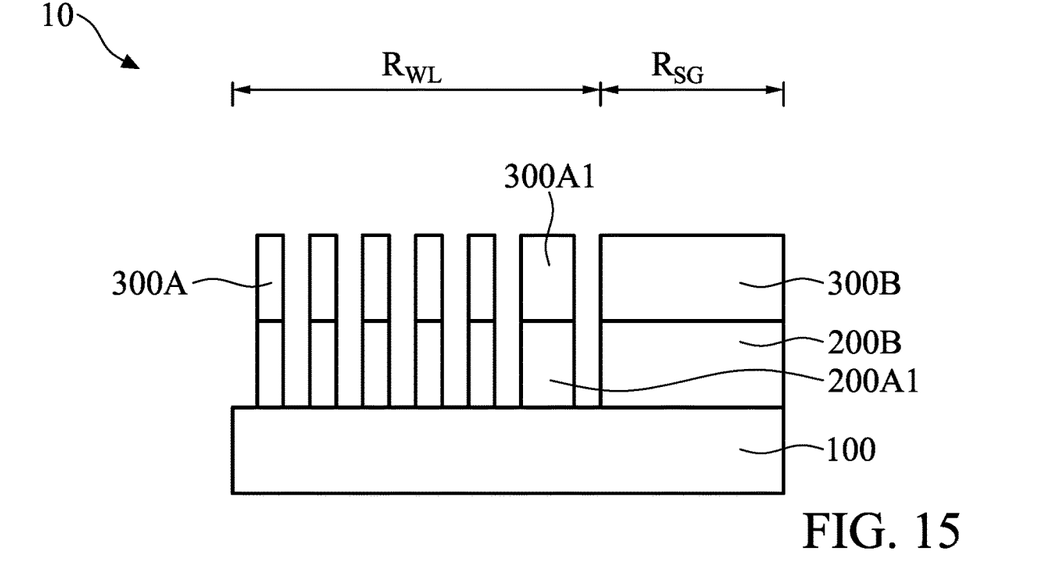

Next, referring to FIG. 12, all the spacers 800A are removed to expose the top surface of each second hard masks 400A. The removal of the spacers 800A includes the etching process as previously mentioned, and thus is not repeated here.

Next, referring to FIGS. 13-16, the patterns of the second hard masks 400A and 400B are transferred to the active layer 200 to form word lines 200A in the predetermined word line region $R_{WL}$ and a selective gate 200B in the predetermined selective gate region $R_{SG}$. It should be noted that the pattern of the combined spacer 400A1 is also transferred to the active layer 200 to form a first word line 200A1 in the predetermined word line region $R_{WL}$. In some embodiments, the transfer of the patterns of the second hard masks 400A and 400B includes etching the first hard mask layer 300 by using the second hard masks 400A and 400B as etching masks to form first hard masks 300A and 300B; removing the second hard masks 400A and 400B; and etching the active layer 200 by using the first hard masks 300A and 300B as etching masks. In some embodiments, the etching process and the removal process included in the transfer of the patterns of the second hard masks 400A and 400B are similar as previously mentioned, and thus are not repeated here.

In some embodiments, the word lines 200A are used to storage charge, the first word line 200A1 is floating and used as a switch, the selective gate 200B is used to control the switch.

Figure 16:
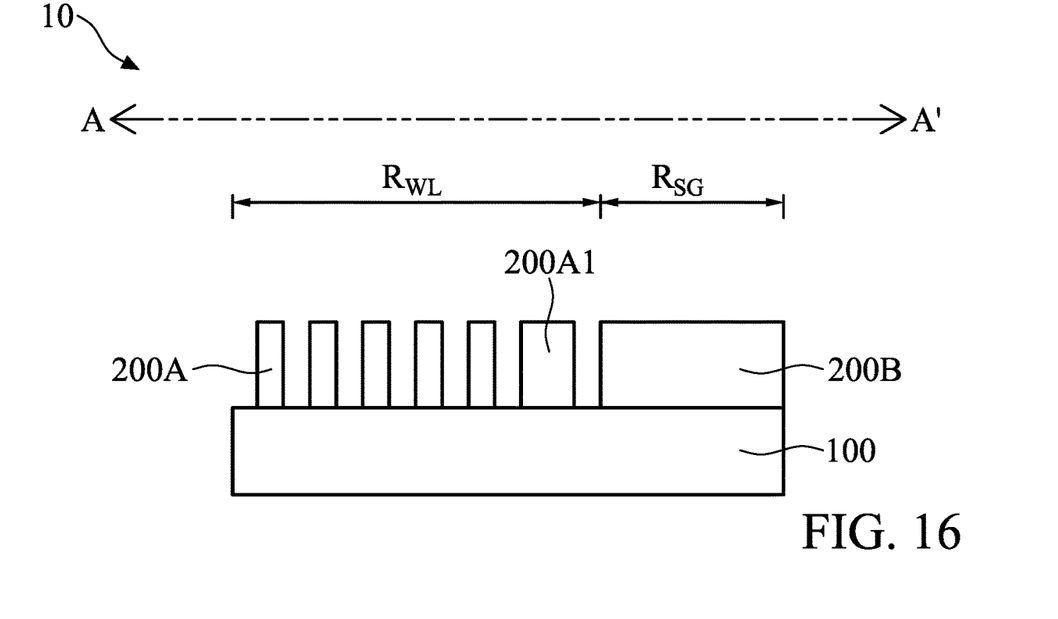
Figure 17:
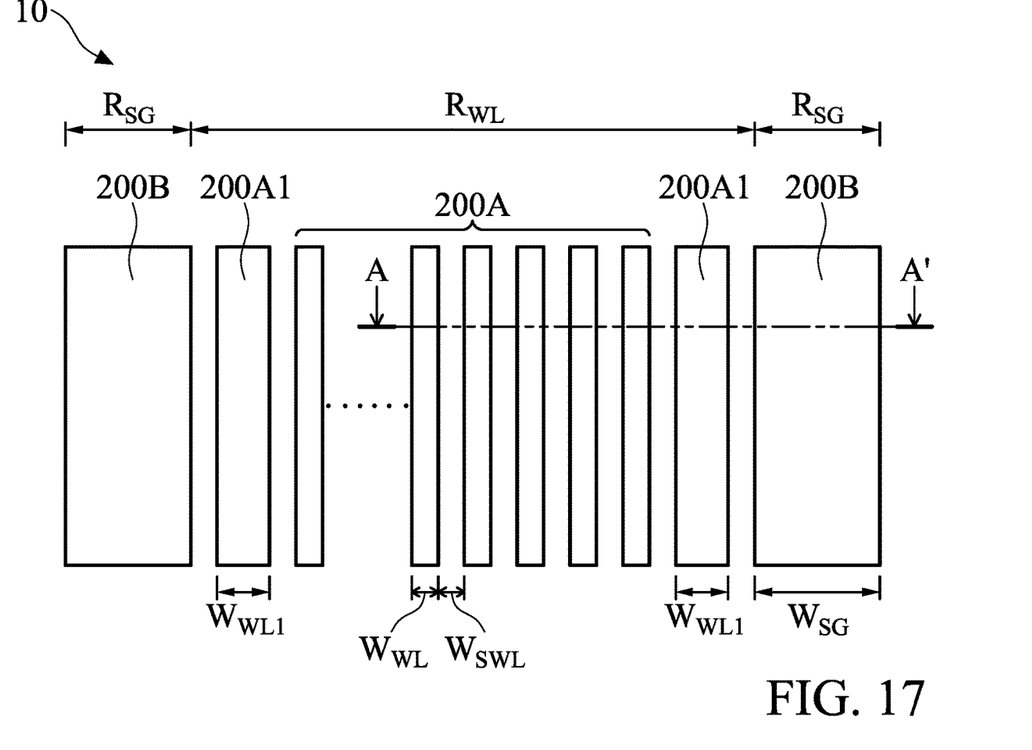
FIG. 17 illustrates a portion of the top view of a semiconductor structure according to some embodiments of the present disclosure.

Next, FIG. 17 illustrates a portion of the top view of the semiconductor structure 10, and FIG. 16 is a cross-sectional view taken along the cross line A-A' of FIG. 17.

From the embodiments of FIG. 17, the predetermined selective gate region $R_{SG}$ is positioned at both sides of the predetermined word line region $R_{WL}$, and the first word line 200A1 is positioned at the outmost sides of the predetermined word line region $R_{WL}$. It should be understood that different configuration may be done for different embodiments depending on actual requirements.

In the embodiments of FIG. 17, the top portion of the word lines 200A has a width of $W_{WL}$, the top portion of the first word line 200A1 has a width of $W_{WL1}$, and the top portion of the selective gate has a width of $W_{SG}$. Also, the spacing $W_{SWL}$ is disposed between the word lines 200A. For brevity, the width mentioned below refers to the width of the top portion of the element.

In some embodiments, the width $W_{WL}$ of each of the word lines (which may or may not include the first word line 200A1) is the same, so that the electrical properties of the subsequent word lines are the same. It should be noted that the first word line 200A1 is used as an on-off, and thus the electrical properties of the other word lines would not be affected.

In addition, in this embodiment, the ratio of the width $W_{WL1}$ of the top portion of the first word line 200A1 to the width $W_{WL}$ of the top portion of the word lines 200A is greater than 1 and less than or equal to 2. Since the word lines 200A (including the first word line 200A1) is defined by the spacers 800A (including the combined spacer 800A1), and the ratio of the width of the combined spacer 800A1 to the width of the spacers 800A is greater than 1 and less than or equal to 2, the ratio of the word lines defined by the spacers should also fall within the above scope.

Figure 18:
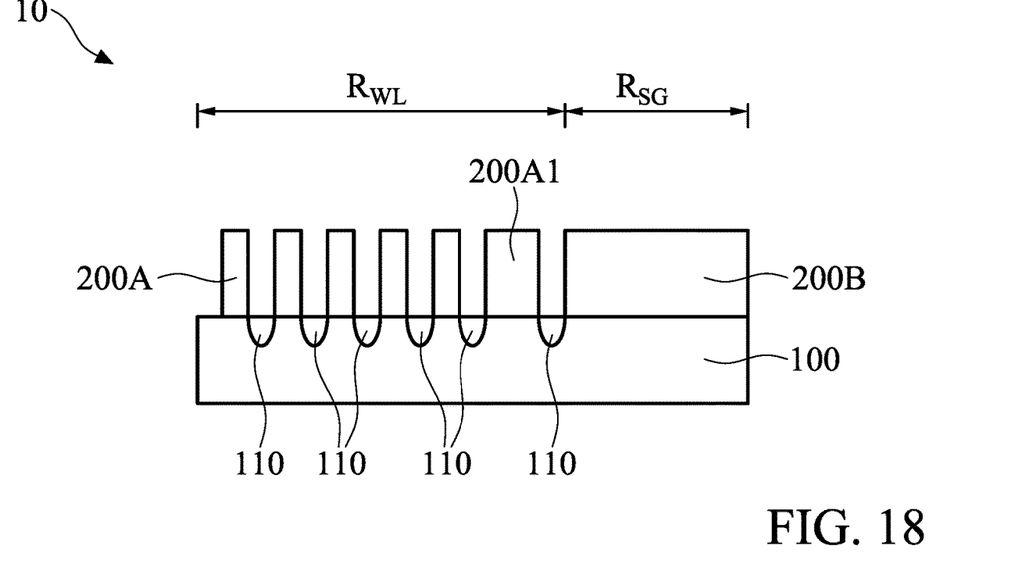
FIG. 18 illustrates a cross-sectional view of a semiconductor structure according to some embodiments of the present disclosure.

Next, referring to FIG. 18, following the semiconductor structure 10 as shown in FIG. 16, the doping region 110 is implanted in the substrate 100 between the word lines 200A and between the first word line 200A1 and the selective gate 200B. In some embodiments, the doping region 110 may cause pairs of electrons and electron holes generated by ion collision to maintain the formation of the channels (not shown). The doping region may include N-type or P-type dopants, such as nitrogen, arsenic, phosphorous, antimony ions, or boron, aluminum, gallium, indium, boron trifluoride ions ($BF^{3+}$).

In summary, the method for forming the semiconductor structure provided by the present disclosure include the formation of the combined spacer wider than the other spacers so that the other spaces may be protected from being damaged or disconnected during the subsequent process, and thus avoiding affecting the electrical performance. Therefore, the wider combined spacer provided by the present disclosure may resist damage caused by plasma during the etching process, thereby improving the semiconductor's performance.

What is claimed is:

1. A method for forming a semiconductor structure, comprising:

forming an active layer on a substrate, wherein the substrate has a predetermined word line region and a predetermined selective gate region adjacent thereto;

forming a hard mask stack on the active layer, wherein the hard mask stack comprises a first hard mask layer, a second hard mask layer, and a third hard mask layer sequentially formed on the active layer;

patterning the third hard mask layer to form third hard masks in the predetermined word line region and the predetermined selective gate region, wherein a first spacing is disposed between adjacent two of the third hard masks in the predetermined word line region nearest to the predetermined selective gate region, wherein the first spacing is less than a second spacing between any two of the third hard masks other than the adjacent two of the third hard masks;

forming spacers on sidewalls of the third hard masks, wherein two of the spacers on opposite sides of the sidewalls of the adjacent two of the third hard masks merge into a combined spacer;

removing the third hard masks;

forming a patterned mask structure in the predetermined selective gate region, wherein the patterned mask structure covers the second hard mask layer and the spacers; and transferring patterns of the spacers in the predetermined word line region to the active layer to form word lines in the predetermined word line region and transferring a pattern of the patterned mask structure to the active layer to form a selective gate in the predetermined selective gate region, wherein the step of the transferring the patterns of the spacers in the predetermined word line region comprises transferring the pattern of the combined spacer to the active layer in order to form a first word line nearest the selective gate.

2. The method as claimed in claim 1, wherein a ratio of the second spacing to the first spacing is greater than or equal to 1.5 and less than 3.

3. The method as claimed in claim 1, wherein a top portion of the combined spacer has a V-shaped profile.

4. The method as claimed in claim 1, wherein opposite sides of the combined spacer have straight sidewalls.

5. The method as claimed in claim 1, wherein a ratio of a width of the combined spacer to a width of any one of the spacers other than the combined spacer is greater than 1 and less than or equal to 2.

6. The method as claimed in claim 1, wherein a ratio of a height of the patterned mask structure to a height of any one of the spacers is greater than or equal to 1.5.

7. The method as claimed in claim 1, wherein a ratio of a height of the patterned mask structure to a height of any one of the spacers is less than or equal to 10.

8. The method as claimed in claim 1, wherein the step of the forming the spacers on the sidewalls of the third hard masks comprises:

depositing a spacer material layer on a top surface and the sidewalls of the third hard masks and on the second hard mask layer; and anisotropically etching the spacer material layer until a portion of a top surface of the second hard mask layer is exposed.

9. The method as claimed in claim 8, wherein each of the third hard masks comprises a dielectric mask and a sacrificial mask on the dielectric mask.

10. The method as claimed in claim 9, wherein the step of the depositing the spacer material layer on the top surface and the sidewalls of the third hard masks comprises depositing the spacer material layer on the top surface and sidewalls of the sacrificial mask of each of the third hard masks and sidewalls of the dielectric mask of each of the third hard masks; and wherein the step of the anisotropically etching the spacer material layer comprises removing the spacer material layer on the top surface and the sidewalls of the sacrificial mask of each of the third hard masks.

11. The method as claimed in claim 9, wherein a top surface of each of the spacers is level with an interface of each of the dielectric masks and each of the sacrificial masks.

12. The method as claimed in claim 1, wherein a width of the first word line is less than a width of the selective gate.

13. The method as claimed in claim 1, further comprising an anti-reflection coating layer before patterning the third hard mask layer.

14. The method as claimed in claim 1, wherein a width of the first word line is greater than a width of any other one of the other word lines.

15. The method as claimed in claim 1, wherein a ratio of a width of the first word line to a width of any other one of the other word lines is greater than 1 and less than or equal to 2.

16. The method as claimed in claim 1, wherein the step of transferring the patterns of the spacers in the predetermined word line region to the active layer to form the word lines in the predetermined word line region and transferring the pattern of the patterned mask structure to the active layer to form the selective gate in the predetermined selective gate region comprises:

etching the second hard mask layer by using the spacers and the patterned mask structure as etching masks to form second hard masks;

removing the spacers and the patterned mask structure;

etching the first hard mask layer by using the second hard masks as etching masks to form first hard masks;

removing the second hard masks; and etching the active layer by using the first hard masks as etching masks.

* * * * *